United States Patent [19]

Shinohara

[11] Patent Number: 5,587,738
[45] Date of Patent: Dec. 24, 1996

[54] SOLID-STATE IMAGE PICKUP DEVICE HAVING PLURAL SWITCHES FOR SUBTRACTING A STORED SIGNAL FROM A PIXEL OUTPUT

[75] Inventor: Mahito Shinohara, Tokyo, Japan

[73] Assignee: Canon Kabushiki Kaisha, Tokyo, Japan

[21] Appl. No.: 342,042

[22] Filed: Nov. 17, 1994

[30] Foreign Application Priority Data

Nov. 17, 1993 [JP] Japan .................................. 5-287854
Nov. 17, 1993 [JP] Japan .................................. 5-287855

[51] Int. Cl.$^6$ ............................................ H04N 5/335
[52] U.S. Cl. ......................... 348/302; 348/301; 348/307; 348/308
[58] Field of Search ..................... 348/300, 302, 348/301, 307, 308, 311, 315, 294, 303, 304; H04N 5/335

[56] References Cited

U.S. PATENT DOCUMENTS

| Re. 34,309 | 7/1993 | Tanaka et al. | 358/213.31 |
|---|---|---|---|
| 4,731,656 | 3/1988 | Dischert et al. | 358/213.25 |
| 5,043,821 | 8/1991 | Suga et al. | 358/213.29 |
| 5,146,339 | 9/1992 | Shinohara et al. | 358/212 |
| 5,172,249 | 12/1992 | Hashimoto | 358/482 |
| 5,288,988 | 2/1994 | Hashimoto et al. | 250/208.1 |

FOREIGN PATENT DOCUMENTS

| 0400985 | 12/1990 | European Pat. Off. | H01L 27/146 |
|---|---|---|---|
| 0473294 | 3/1992 | European Pat. Off. | H01L 27/146 |
| 0481373 | 4/1992 | European Pat. Off. | H04N 3/15 |
| 0488674 | 6/1992 | European Pat. Off. | H04N 5/217 |
| 0577391 | 1/1994 | European Pat. Off. | H04N 3/15 |

OTHER PUBLICATIONS

Patent Abstracts Of Japan, vol. 7, No. 236 (E–205) 20 Oct. 1983 & JP–A–58 125 982 (Matsushita Denki Sangyo KK) 27 Jul. 1983 *abstract*.

Hiratsuka, "A 310K Pixel Bipolar Imager (BASIS),"IEEE International Solid–State Circuits (Digest of Technical Papers) vol. 32, 1989, New York. pp. 96–97, XP000066838.

*Primary Examiner*—John K. Peng
*Assistant Examiner*—Ngoc-Yen Vu
*Attorney, Agent, or Firm*—Fitzpatrick, Cella, Harper & Scinto

[57] ABSTRACT

A solid-state image pickup device includes a light receiving cell for accumulating electric charges created in response to a photo energy striking the gate of an amplification-type sensor and then produces a signal from the source region based on the accumulated carriers, a memory cell including an amplification-type memory cell having the same type as that of the abovementioned amplification-type sensor, to accumulate a signal transferred from the light receiving cell into the base region of the amplification-type memory cell, and a signal line for electrically connecting the source region of the light receiving cell and the source region of the memory cell. The shift of the accumulation start timing to each row of the light receiving cells is suppressed to a small value. The same signal can be read from the memory cell several times.

3 Claims, 12 Drawing Sheets

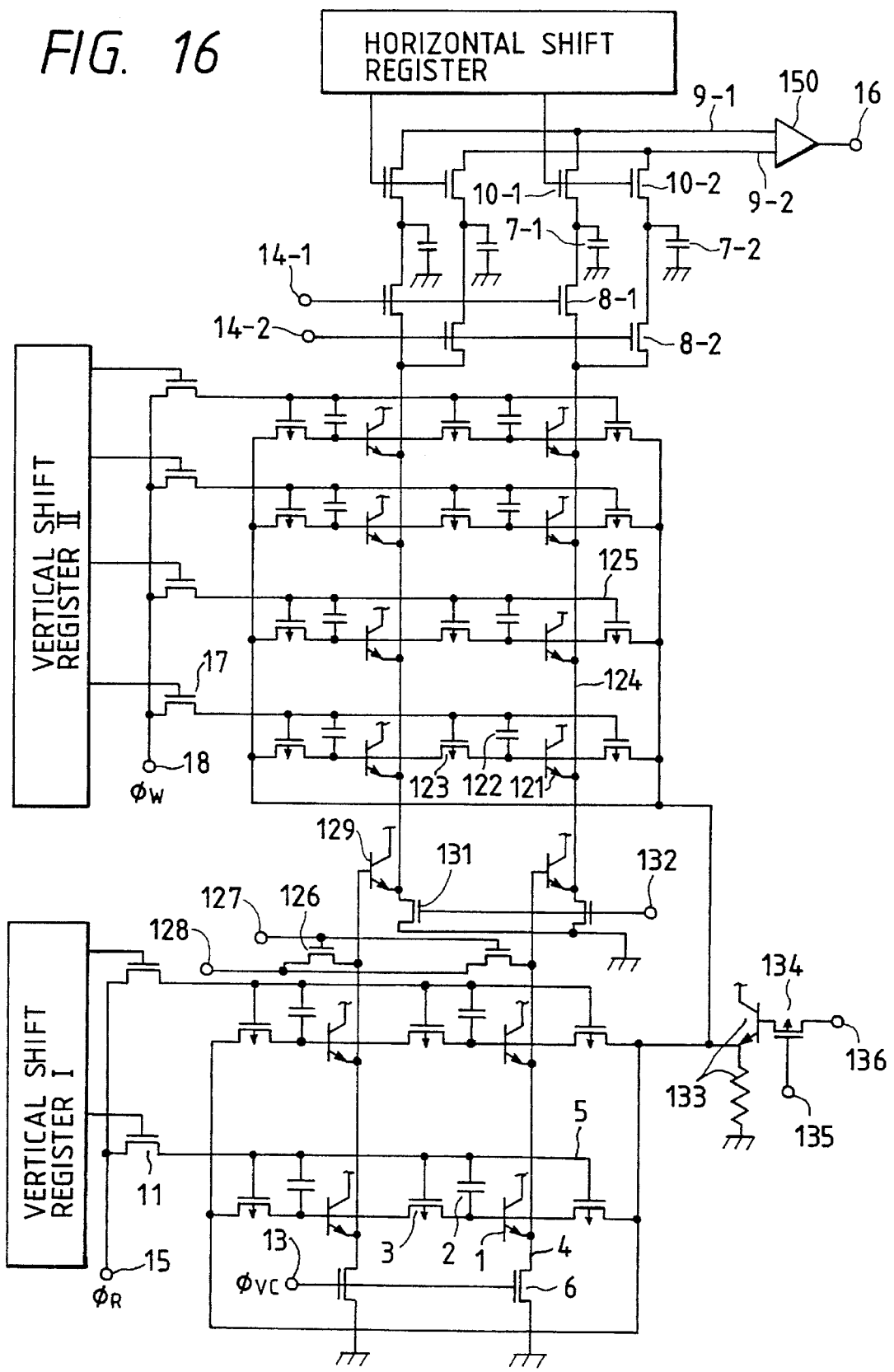

SOLID-STATE IMAGE PICKUP DEVICE HAVING PLURAL SWITCHES FOR SUBTRACTING A STORED SIGNAL FROM A PIXEL OUTPUT

BACKGROUND OF THE INVENTION

1. Field of the Invention

The present invention relates to a solid-state image pickup device and more particularly to a solid-state image pickup device including amplification-type light receiving cells.

2. Related Background Art

FIGS. 1 to 4 show a structural example of a conventional solid-state image pickup device, respectively. FIG. 1 is a diagram showing the entire circuit configuration. The pixels 12-11 to 12-mn are arranged in a matrix form in a substrate. Each pixel is formed of an n-channel, normally-on-type (depletion-type) static induction transistor (SIT) 22, a gate capacitor 24 arranged to the floating gate 23 of the SIT 22, and a p-channel, enhancement-type control transistor 25 having a source-drain path connected to the floating gate 23 (in figure, each pixel is shown in broken line). A video voltage Vd is applied to the drain electrode (substrate) of the SIT forming each pixel to connect the row lines 26-1 to 26-m to the gate capacitors of the SITs in each of the row groups of the pixels 21-11 to 21-1n, . . . , 21-ml to 21-mn arranged in the X-direction, so that the vertical scanning circuit (vertical shift register) 27 supplies the row selection signal $\phi_{G1}$ to $\phi_{GM}$. Each of the column lines 28-1 to 28-n is connected to the sources of the SITs in the column groups of pixels 21-11 to 21-ml, . . . , 21-1n to 21-mn arranged in the Y-direction. The column lines are grounded via the column selection transistors 29-1 to 29-n, the common video line 30, and the load resistor 31. The horizontal scanning circuit (horizontal shift register) 32 applies the column selection signals $\phi_{S1}$ to $\phi_{SN}$ to the gates of the column selection transistors 29-1 to 29-n. Moreover, the control gate line 33 is connected to the gate electrode of the control transistor forming each pixel to apply the control gate signal $\phi_C$. The overflow drain line 34 is connected to the drain electrode of the control transistor 25 to apply the control drain voltage $V_C$.

FIG. 2 is a plan view showing the layout of four pixels adjoining to one another. FIG. 3 is a cross-sectional view showing the layout taken along the line A–A'. In this layout example, in order to improve the area efficiency of pixels formed on the substrate 40, the adjoining four pixels are symmetrically formed laterally and horizontally in the figure. The substrate 40 serves as the drain of a static induction transistor and is formed of an $n^+$ or n-type semiconductor. An $n^-$ epitaxial layer 41 is grown on the substrate 40. An isolation region 42 such as a buried insulating material is formed in the epitaxial layer 41 to separate electrically and optically the adjoining pixels. In each pixel, the gate and the source of the SIT are respectively formed by the $p^+$ diffusion layer 43 and the $n^+$ diffusion layer 44 formed on the surface of the epitaxial layer 41. The $n^+$ diffusion layer 44 is connected to the corresponding column lines 28-i and 28-(i+1) via the wiring layer 45, for example, formed of polycrystalline silicon. The row line electrodes 46-i and 46-(i+1) of, for example, polycrystalline silicon are formed on the $p^+$ diffusion layer 43 to form the row lines 26-i and 26-(i+1) via the gate oxide film. Thus, a gate capacitor is formed at a portion where the row line electrode confronts the $p^+$ diffusion layer 43.

The $p^+$ diffusion region 43 of each pixel is formed so as to extend toward the middle portion of the adjoining four pixels and acts as the source of the control transistor 25 of each pixel. The $p^+$ diffusion layer 47, which acts as the common drain of the control transistors of the four pixels, is formed in common in the surface of the epitaxial layer 41 in the middle portion among the four pixels, isolated from locating apart from the gate of the SIT from the $p^+$ diffusion layer forming the source of the control transistor in each pixel. The overflow drain line 34 is connected to the $p^+$ diffusion layer 47 by way of the wiring electrode 48. The control gate electrode 49 of the control transistor for the four pixels is arranged in common on the gate oxide film over the surface of the epitaxial layer 41 between the $p^+$ diffusion layers 43 and 47 to form the control gate line 33.

Let us explain below the operation of the above-configuration, with reference to the signal waveforms shown in FIG. 4. In this configuration, as described above, pixel signals are sequentially read out in accordance with the X-Y address system where the row lines 26-1 to 26-m are sequentially selected while the column lines 28-1 to 28-n are sequentially selected. All pixels in a selected row line are simultaneously reset during the horizontal blanking period $t_{BL}$, or the duration from the completion of the signal reading period $t_H$ of each row line to the next row selection. In particular, the operation of the pixel 21-22 shall be explained below, with reference to the change in the potential $V_G$ (2,2) of the floating gate shown in FIG. 4. In the floating gate potential $V_G$ (2,2) of the pixel 21-22 shown in FIG. 4, the broken line represents the voltage where there is no incident light during imaging.

At the timing $t_1$, when the voltage of the row selection signal $\phi_{G2}$ applied to the row line 26-2 becomes $V\phi_G$, the potential of the floating gate of each SIT connected to the row line is nearly boosted by $V\phi_G$, more exactly, by the value expressed by the following formula:

$$(C_G/C_J+C_G)\cdot V\phi_G$$

where $C_G$ is the capacitance of the gate capacitor 24 and $C_J$ is the parasitic capacitance of the $P^+$ diffusion 43. At the timing $t_2$, when the column line 28-2 or the pixel 21-22 is selected in response to the row selection signal $\phi_{S2}$ reaching a high voltage level, the signal current depending on the gate potential $V_G$ (2,2) of the pixel 21-22 flows through the load resistor 31 via the column line 28-2, the column selection transistor 29-2, and the video line 30. The voltage drop across the load resistor 31 is read out as an output signal Vout. This signal reading operation is a nondestructive because the light electric charges accumulated in the floating gate are normally left unchanged.

Next, at the timing $t_3$ at which the signal reading from all the pixels 21-21 to 21-2n connected to the row line 26-2 has been completed by completing the selection of the final line 28, or at the beginning of the horizontal blanking period $t_{BL}$, the control gate signal $\phi_C$ (voltage) applied to the control gate line 33 is $-V\phi_C$ that turns on the control transistor 25. At this time, since the surface potential $\phi_S$ underneath the control gate 49 changes from $\phi_S(O)$ to $\phi_S(-V\phi_C)$, the gate potential $V_G$ (2,2) is forcibly clamped to the potential $\phi_S(-V\phi_C)$. This operation resets the gate potential so that the photo-electric charges $Q_P$ which are accumulated in the gate due to the light illumination are swept out. The voltage $-V\phi_C$ of the control gate signal $\phi_S$ is set in such a manner that the surface potential $\phi_S(-V\phi_C)$ underneath the control gate electrode 49 equals substantially to the pinch-off voltage $V_{GO}$ of the SIT when the control gate signal is applied while the control drain voltage $V_C$ satisfies $\phi_S(-V\phi_C)>V_C$.

At the timing $t_4$, or the final point of the horizontal blanking period $t_{BL}$, the row selection signal $\phi_{G2}$ is at a low level while the control gate signal $\phi_C$ is at zero volt. Thus, the gate potential $V_G(2,2)$ is lowered in accordance with the formula: $V_G(2,2)=\phi_S (-V\phi_C)-V\phi_G$. Thereafter, the gate potential is increased by, e.g. $Q_P/C_G(=\Delta V_{GP})$ because the light electric charges are integrated in accordance with the light received during the imaging period extending to the next reading operation.

In the present configuration, the control gate signal $\phi_C$ is applied to the control gate electrodes of all the pixels in selection state, in addition to the control gate electrode of the pixel connected to a selected row line. Therefore, when the control gate signal $\phi_C$ becomes a voltage $-V_C$, the surface potential underneath the control gate electrode of a non-selection pixel becomes $\phi_S(-V\phi_C)$, or equals nearly to the pinch-off voltage $V_{GO}$ of the SIT so that a part of the non-selection pixels accumulate the same amount of light electric charges. Hence, even if the boosted gate potential $\Delta V_{GP}$ satisfies $\phi_S(-V\phi_C)-V\phi_G +_{\Delta VGP}>\phi_S(-V\phi_C)$, or $\Delta V_{GP}>V\phi_G$, the light electric charges corresponding to the potential $\phi_S(-V\phi_C)$, or the Gate potential exceeding the pinch-off voltage $V_{GO}$ of the SIT, are swept out to the overflow drain line 34 via the channel underneath the control Gate electrode. Moreover, since the overflow operation of the excessive electric charges is performed to all the non-selection pixels every time the row line is switched, intense incident light does not cause the potential of the floating gate to exceed the pinch-off voltage $V_{GO}$. Hence, a half-selection signal phenomenon can be effectively prevented. It can be said that a blooming control is performed equivalently. Since resetting each pixel is performed by clamping the floating gate of the SIT to the potential $\phi_S(-V\phi_C)$ using the control gate signal $\phi_C$, the residual photo-electric charge can be completely eliminated at the reset time. Hence, the present configuration can completely suppress many afterimage phenomena seen often when resetting is done by biasing forwardly the pn junction between the gate and the source region of the SIT. However, the above-conventional example has an operational limitation that since reading and resetting operations are sequentially performed to each row, the accumulation timing for each row is shifted so that the accumulation time for each row may be varied when a video signal during, for example, a specific period is taken out. The SIT-type and amplification-type image element itself can perform a nondestructive reading operation. However, there has been a problem that with the light receiving surface kept illuminated with light, when the second reading is done without resetting after the first reading, light incident entering between the first and second reading operations varies the signal amount.

SUMMARY OF THE INVENTION

The object of the present invention is to provide an improved solid-state image pickup device that overcomes the foregoing problems.

In order to achieve the objects described above, the solid-state image pickup device according to an embodiment of the present invention is characterized by a light receiving cell including a transistor, for accumulating electric charges created in response to a photo energy striking the control electrode region and then for producing a signal from a main electrode region based on the accumulated carriers, the transistor having the control electrode region and the main electrode region which are formed in a semiconductor substrate of a first conductivity-type, the control electrode region being formed of a second conductivity-type opposite to the first conductivity-type, the main electrode region being formed of a semiconductor of the first conductivity-type, whereby current through the main electrode region is controlled by varying the size of a depletion layer defined between the control electrode region and the main electrode region by a potential of the control electrode region; a memory cell including a transistor and a memory cell corresponding to the transistor, to accumulate a signal transferred from the light receiving cell into a control electrode region of the memory transistor; and a signal line for electrically connecting the main electrode region for the light receiving cell and the main electrode region for the memory cell.

The memory transistor may be a transistor where the current flowing through the main electrode region is adjusted by controlling the volume of the depletion layer defined between the control electrode region and the main electrode region with a potential applied to the control electrode region. But that does not mean memory transistors formed of the same type. For example, SIT elements may be used as the light receiving cell and FETs may be used as the memory cell, or vice versa.

The embodiment of the present invention includes the same type transistor as the type of the light receiving cell forming transistor and memory cells each of which accumulates a signal transferred from the light receiving cell into the control electrode region of the same-type transistor. The shift in the accumulation start timing of each row line associated with the light receiving cells can be minimized by transferring signals from the light receiving cells to the memory cells of each row line to write them by one operation. The shielded memory cell, mode of a transistor that can read out non-destructively a signal to the memory, can read out the same signal several times.

According to another embodiment of the present invention, the solid-state image pickup device, wherein plural photoelectric conversion pixels each of which accumulates electric charges created due to the energy of received light and amplifies electric charges are arranged in a matrix form, is characterized by a transistor having a control electrode coupled capacitively to the output side of each of the photoelectric conversion pixels; and a switch for switching the control electrode to a predetermined potential or an electrically-floated state, whereby a pixel signal is outputted from a main electrode of the transistor.

According to the further another embodiment of the present invention, the solid-state image pickup device, wherein plural photoelectric conversion pixels each of which accumulates electric charges created due to the energy of received light and produces the amplified electric charges are arranged in a matrix form, is characterized by a transistor having a control electrode coupled to the output side of each of the photoelectric conversion pixels; signal accumulation pixels of which the number is twice the number of the photoelectric conversion pixels, each of the accumulation pixels to which both a pixel signal formed of a noise component output from a main electrode of the transistor and a pixel signal including the noise component are written; and a means for subtracting a pixel signal formed of a noise component output from each of the signal accumulation pixels from a pixel signal including the noise component.

As shown in FIG. 5, the switch SW sets the base potential (the potential of one electrode of the capacitor C connected to the base) of the bipolar transistor Tr to $V_1$ to input the image output $V_N$ including no light signal such as an LED light from the photoelectric conversion pixel (S) to the other electrode of the capacitor C. In this case, the potential at the other electrode of the capacitor C is $V_N$ and the base potential (the potential of the electrode of the capacitor C connected to the base side) is $V_1$.

Next, when the switch SW makes the electrode of the capacitor C on the base connection side in an electrically floating state, the pixel output $V_{N+S}$ including the light signal is input from the photoelectric conversion pixel (S) to the other electrode of the capacitor C. At this time, the potential at the other electrode of the capacitor C changes from $V_N$ to $V_{N+S}$ while the base potential changes from $V_1$ to $(V_1+V_{N+S}-V_N)$. Thus the signal based on the light signal component $(V_{N+S}-V_N)$ can be output from the emitter, or the main electrode, of the bipolar transistor Tr. As a result, there are no variations in light receiving pixel and bipolar transistor. The sensor output with high S/N ratio can be obtained without increasing the sensing area by subtracting an external light signal.

The other electrode of the capacitor C may be reset (to the potential $V_2$) after the electrode of the capacitor C connected to the base has been electrically floated. In this case, the potential of the other electrode of the capacitor C changes from $V_N$ to $V_2$ while the potential of the electrode of the capacitor C connected to the base changes from $V_1$ to $(V_2-V_N+V_1)$. When the pixel output $V_{N+S}$ is inputted to the other electrode of the capacitor C, the potential of the other electrode of the capacitor C changes from V2 to $V_{N+S}$ while the base potential changes from $(V2-V_N+V1)$ to $(V_{N+S}-V_N+V1)$. Similarly, a signal based on the light signal component $(V_{N+S}-V_N)$ can be outputted from the emitter of the bipolar transistor Tr.

As shown in FIG. 6, the pixel output $V_N$ including no light signal such as LED light is temporarily accumulated into the signal accumulation pixel M. Thereafter, when the switch SW sets the base potential of the bipolar transistor Tr to V1, the output $V_N$ is output from the signal accumulation pixel M to the other electrode of the capacitor C through the switch SW2. Then, when the base of the bipolar transistor Tr is made in an electrically floating state and the potential of the other electrode of the capacitor C is reset to V2, the output $V_{N+S}$ including the light signal is outputted from the photoelectric conversion pixel. Thus, a signal based on $(V_{N+S}-V_N)$ is outputted from the emitter of the bipolar transistor Tr and then is again accumulated into the signal accumulation pixel M. This operation allows the sensor output with high S/N ratio to be obtained by subtracting variations in light receiving pixel, bipolar transistor Tr and accumulation pixel, and external light components.

As shown in FIG. 7, the signal accumulation pixels M1 doubled in number to the photoelectric conversion pixel S are arranged. The pixel output $V_N$ including no light signal such as LED light is accumulated into the signal accumulation pixel M1 through the bipolar transistor Tr. The pixel output $V_{N+S}$ including light signal is accumulated into the signal accumulation pixel M2 through the bipolar transistor Tr. The subtracting process is performed after reading the pixel output $V_N$ from the signal accumulation pixel M1 and the pixel output $V_{N+S}$ from the signal accumulation pixel M2 so that the signal based on the light signal component $(V_{N+S}-V_N)$ can be output.

Other objects and features of the present invention will be apparent with reference to the following specification and the attached drawings.

BRIEF DESCRIPTION OF THE DRAWINGS

FIG. 16 is a schematic circuit diagram showing the solid-state image pickup device according to the seventh embodiment of the present invention.

DETAILED DESCRIPTION OF THE PREFERRED EMBODIMENTS

An embodiment of the present invention will be explained below with reference to the attached drawings.

Figure 8:
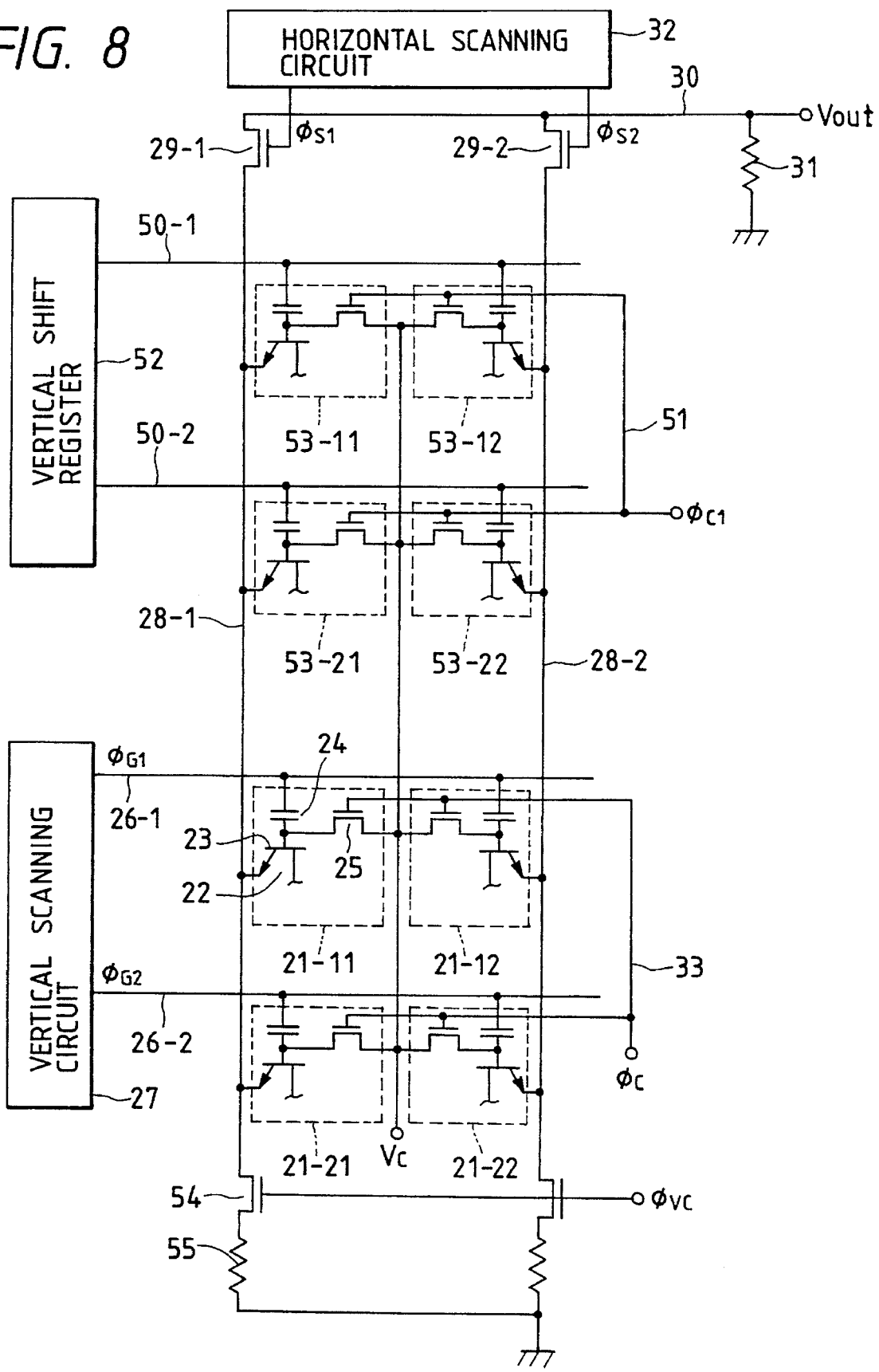
FIG. 8 is a schematic circuit diagram showing the solid-state image pickup device according to the first embodiment of the present invention.

FIG. 8 is a schematic circuit diagram showing the solid-state image pickup device according to the first embodiment of the present invention.

Figure 1:
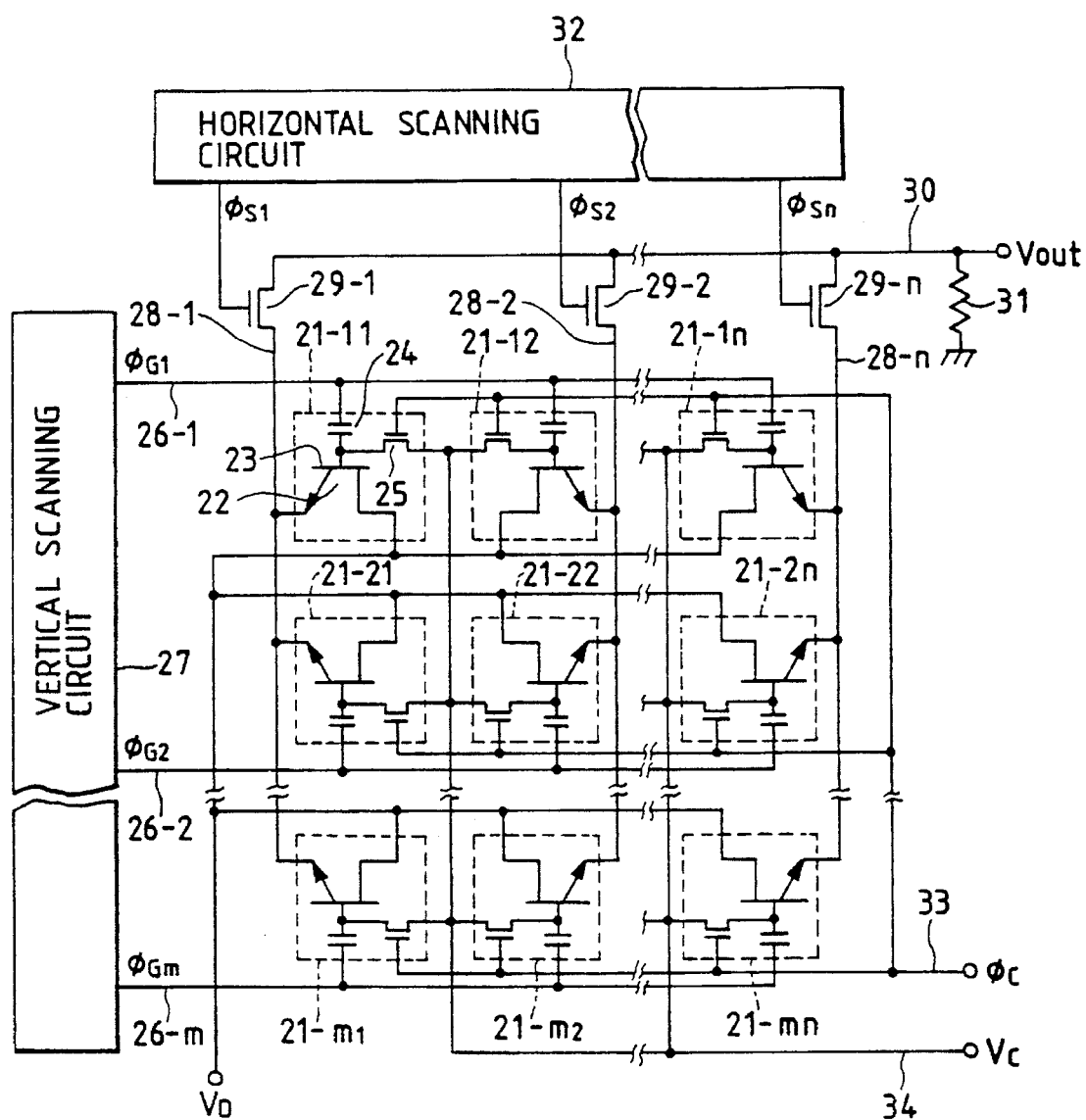
FIG. 1 is a schematic circuit diagram showing the configuration of a conventional solid-state image pickup device.

Since the system configuration of the sensor cell (light receiving cell) is similar to that shown in FIG. 1, the duplicate explanation on the elements with same numerals will be omitted. For the simplified explanation, a 2×2 pixel structure formed of sensor cells and memory cells is shown here. Referring now to FIG. 8, the memory cells 53-11, 53-12, 53-21, and 53-22 transfer the outputs from the sensor cells 21-11, 21-12, 21-21, and 21-22, respectively. The memory cells have the same structure as the sensor cells. Numerals 50-1 to 50-2 represent a row drive line to which the vertical shift register 52 outputs a drive signal, respectively; 51 represents the gate line of a MOS transistor that resets the bases of the memory cells 53-11 to 53-22; φcl represents a reset pulse for the memory cells 53-11 to 53-22; 54 represents a MOS transistor connected to vertical output lines (column lines) 28-1 and 28-2; and 55 represents a load resistor connected to each row line.

Figure 9:
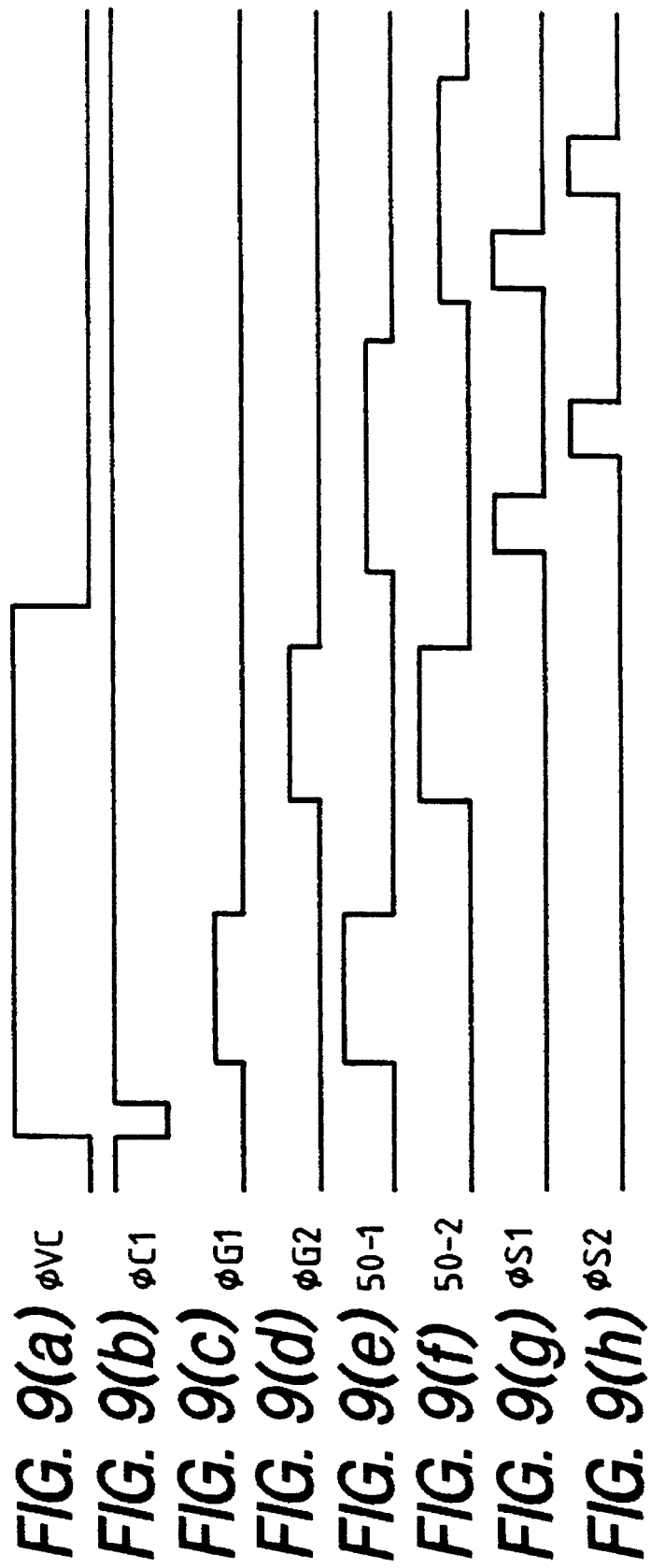
FIG. 9 is a pulse timing chart showing the operation of the first solid-state image pickup device.

FIG. 9 is a timing chart showing the operation of transferring a signal from a sensor unit to a memory unit and of reading a signal out of the memory unit.

Referring to FIG. 9, the MOS transistors 54 are turned ON in response to a high level of the pulse $\phi_{VC}$ to connect the load resistor 55 to the vertical output lines 28-1 and 28-2, respectively. The potential of the gate electrode in the memory cell is set to a higher value than the pulse $\phi_{C1}$. In this case, the intermediate level of the pulse G1 causes the reading operation from the sensor cell, with a reverse bias applied between the source and the gate. At the same time, with a high level of the row drive line 50-1 and a reverse bias applied between the gate and the source, the gate of the memory unit is boosted by a fixed level higher than the source follower potential determined by the sensor cell and the load resistor 55 so that a sensor signal is transferred to the gate of the memory cell. Next, after the signal transfer has been performed along the second row line, the row drive lines 50-1 and 50-2 are sequentially set to a middle level while the column selection transistors 29-1 and 29-2, which are controlled by the horizontal shift register 32, are sequentially turned on, with the reverse bias applied between the source and the gate, so that a reading operation is carried out through the resistor 31.

In the above-operation, since the signal transfer is done at the same time to each row line, the signal reading operation can be carried out in a shorter time, compared with the conventional example shown in FIGS. 1 to 4 where the row lines are sequentially scanned corresponding to a selected row line to perform a signal reading operation. The shift in the accumulation timing to each row in the sensor unit is small. The use of the memory shielded against light can prevent a signal from being distorted even if a bit-by-bit transfer from the memory unit is slow.

Figure 10:
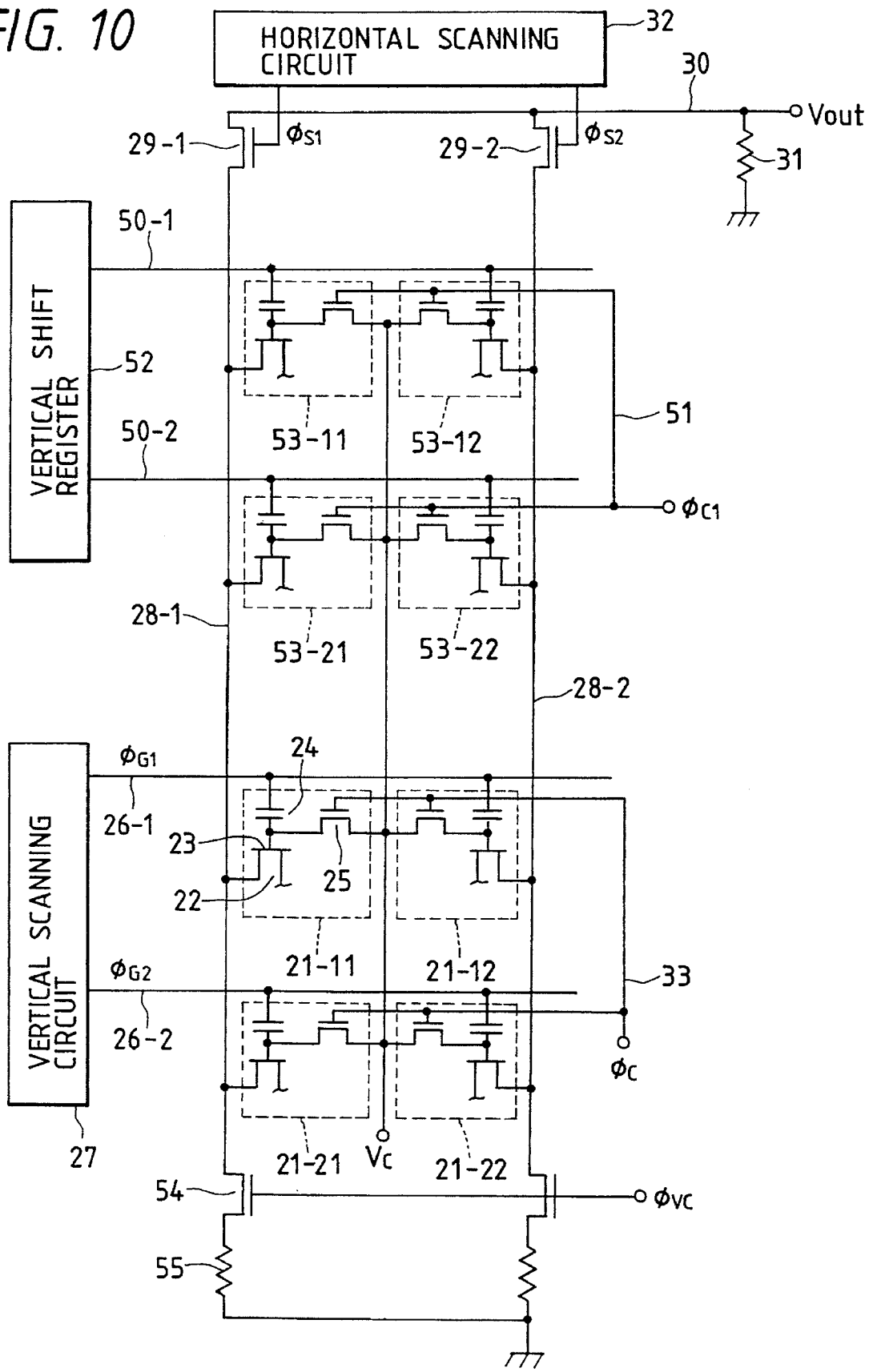
FIG. 10 is a schematic circuit diagram showing the solid-state image pickup device according to the second embodiment.

FIG. 10 shows the second embodiment of the solid-state image pickup device according to the present invention. In this figure, junction-type FETs are used as transistors forming sensor cells and memory cells. The operation resembles that of the first embodiment. In FIG. 10, like numerals are attached to like structural members shown in FIG. 8.

Referring to FIG. 10, like the first embodiment, the light receiving cell reading operation is performed with the gate of a FET biased reversibly. The FET in a cell and the resistor 55 makes a source follower. The memory unit is written by applying the gate potential so as to bias reversibly between the gate and the source.

Unlike the SIT, since the FET has a saturation current characteristic, the linearity of the source follower output to the amount of the signal electric charges is near to 1.0, whereby the photoelectric conversion characteristic for the light sensor can be improved. The SIT is a transistor having a fine channel length but the FET can be manufactured wish a long channel length. Hence, the variation in output due to a variation in cell structure can be minimized.

As described above, the embodiment of the present invention includes a transistor forming a light receiving cell, a memory transistor corresponding to the transistor, and a memory cell for accumulating a signal transferred from the light receiving cell into the control electrode region of the memory transistor. A signal is transferred and written simultaneously from the light receiving cells to the memory cells associated with each row line so that the shift of the accumulation start timing of each row in the sensor unit can be suppressed to a small value.

If a transistor that can read non-destructively a signal to a light shielded memory cell is used, the same signal can be read out of the memory several times. Moreover, the signal electric charge transferred is amplified by making the capacitance of the control electrode region of the memory cell larger than that of the light receiving cell. This feature can suppress the S/N ratio decline due to the noise component such as dark current induced in the memory unit to a small value.

Next, explanation will be made as for the third embodiment of the present invention with reference to the drawings.

Figure 11:
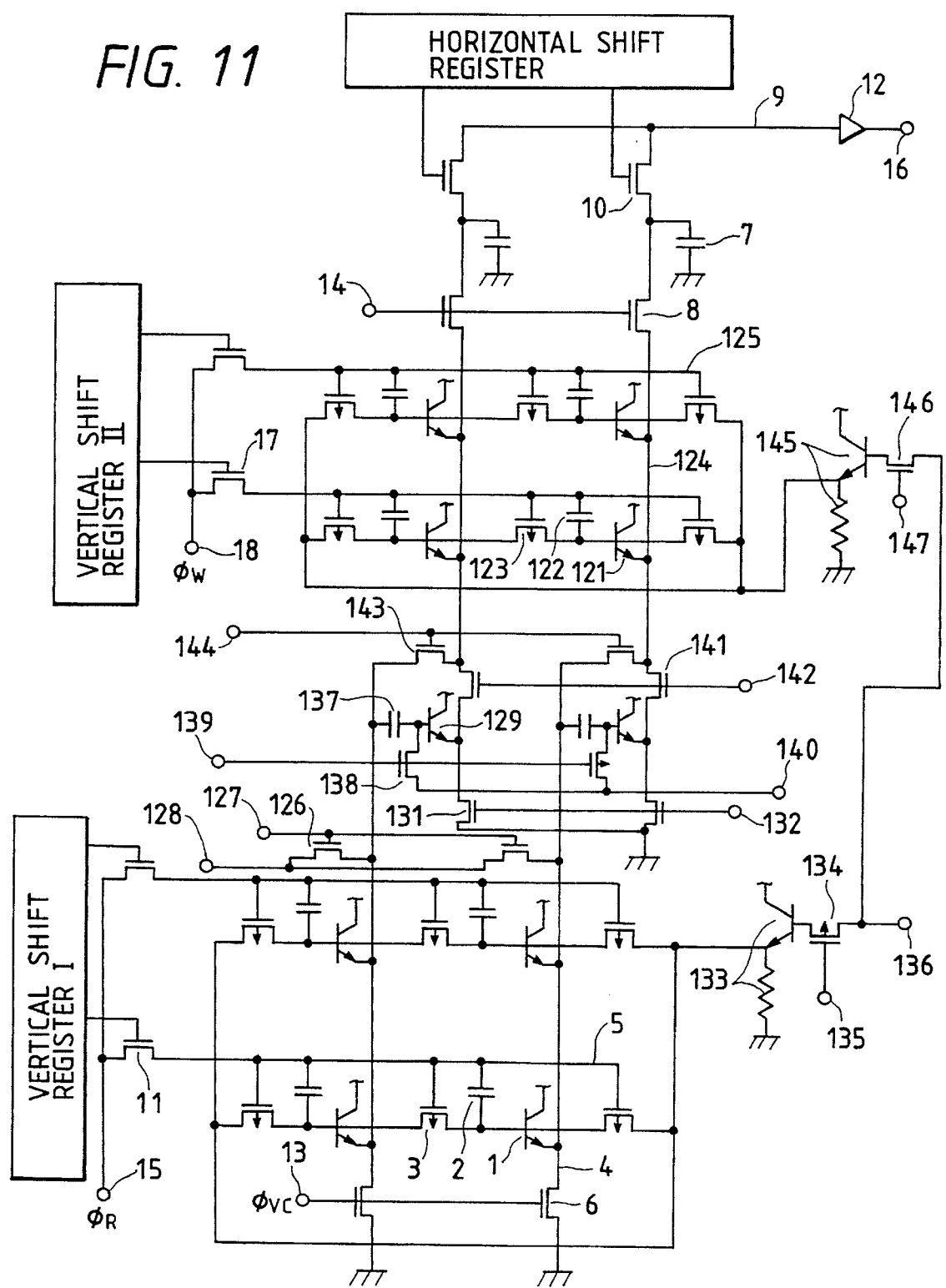
FIG. 11 is a schematic circuit diagram showing the solid-state image pickup device according to the third embodiment of the present invention.

FIG. 11 is a schematic circuit diagram showing the solid-state image pickup device according to the third embodiment of the present invention. In this figure, numeral 1 represents a bipolar transistor (constructing an optical sensor); 2 represents a capacitor which controls the base potential of the bipolar transistor 1; and 3 represents a p-MOS transistor which resets the base potential of the bipolar transistor 1. An imaging pixel acting as a unit is formed of the bipolar transistor 1, the capacitor 2, and the p-MOS transistor 3. Numeral 4 represents a vertical output line; 5 represents a horizontal drive line; 6 represents a MOS transistor which resets the vertical output line 4; 11 represents a buffer MOS transistor which is selected by the vertical shift register I to apply a drive pulse $\phi R$ to a pixel; 15 represents a terminal which applies a sensor drive pulse to the horizontal drive line 5 through the buffer MOS transistor 11; 133 represents an emitter follower; 134 represents a p-MOS transistor; 135 represents a terminal which applies a pulse to the gate of the p-MOS transistor 134; and 136 represents a terminal connected to a positive power source.

Furthermore, numeral 137 represents a capacitor which capacitively couples the vertical output line 4 to the base of the bipolar transistor 129; 138 represents a switching MOS transistor which fixes the base of the bipolar transistor 129 to a predetermined potential; 139 represents a terminal which applies a pulse to the gate of the switching MOS transistor 138; 140 represents a positive power source which specifies the drain voltage of the p-MOS transistor 138; 141 represents a MOS transistor which connects the emitter of the bipolar transistor 129 to the vertical output line 124; 142 represents a terminal which applies a pulse to the gate of the MOS transistor 141; 143 represents a MOS transistor which connects the vertical output line 4 to the vertical output line 124; 144 represents a terminal which applies a pulse to the gate of the MOS transistor 143; 126 represents a MOS transistor which se s the vertical output line 4 to a predetermined potential; 127 represents a terminal which applies a pulse to the gate of the MOS transistor 126; 128 represents a positive power source terminal which specifies the drain voltage of the MOS transistor; 131 represents a MOS transistor which resets the emitter of the bipolar transistor and the vertical output line 124; and 132 represents a terminal which applies a pulse to the gate of the MOS transistor 131.

Numeral 121 represents a bipolar transistor; 122 represents a capacitor which controls the base potential of the bipolar transistor 121; and 123 represents a p-MOS transistor which resets the base potential of the bipolar transistor 121. An accumulating pixel unit is formed of the bipolar transistor 121, the capacitor 122, and the p-MOS transistor 123. Numeral 124 represents a vertical output line; 125 represents a horizontal drive line;. 117 represents a buffer MOS transistor which is selected by the vertical shift register to apply the pulse $\phi w$ to a pixel; 18 represents a terminal which applies the pulse $\phi w$ to the horizontal drive line 125 through the buffer MOS transistor 117; 145 represents an emitter follower which clamps the accumulating pixel; 146 represents p-MOS transistor which switches the base of the emitter follower 45 or the power source terminal 136; and 147 represents a terminal which applies a pulse to the gate of the p-MOS transistor 146.

Furthermore, numeral 7 represents a capacitor which accumulates the output signal from the accumulating pixel; 8 represents a MOS transistor which transfers from an accumulating pixel to the capacitor 7; 14 represents a terminal which applies a pulse to the base of the MOS transistor 8; 9 represents a horizontal output line; 10 represents a MOS transistor which transfers the output from the capacitor 7 to the horizontal output line 9; 12 represents a pre-amplifier which produces a sensor output; and 16 represents a sensor output terminal.

Figure 2:
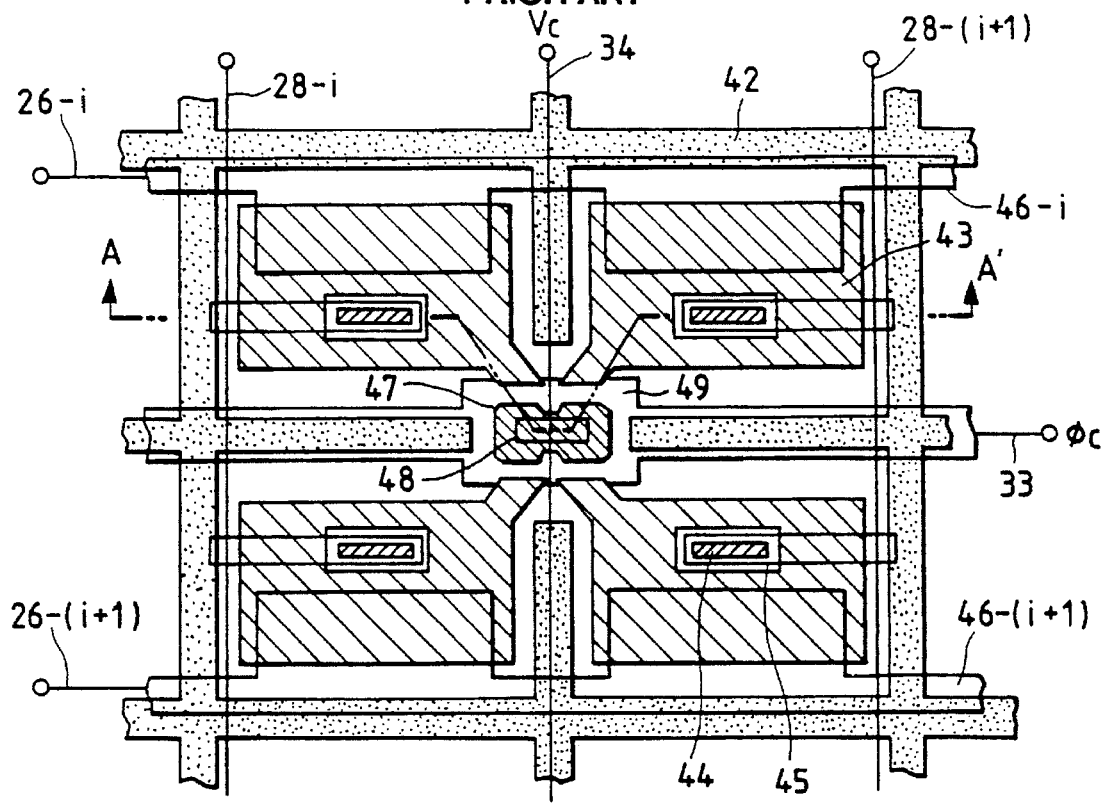
FIG. 2 is a plan view showing the configuration of a conventional solid-state image pickup device.
Figure 3:
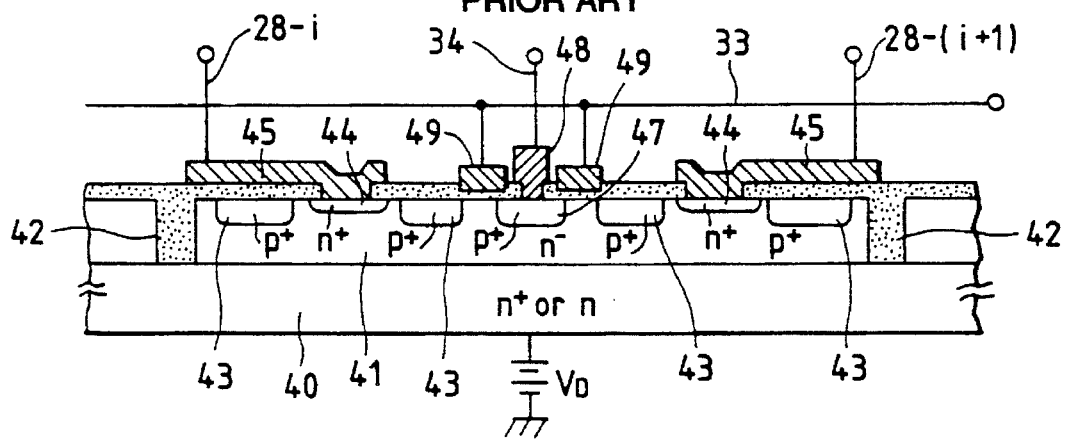
FIG. 3 is a cross sectional view showing the configuration of a conventional solid-state image pickup device.
Figure 4:
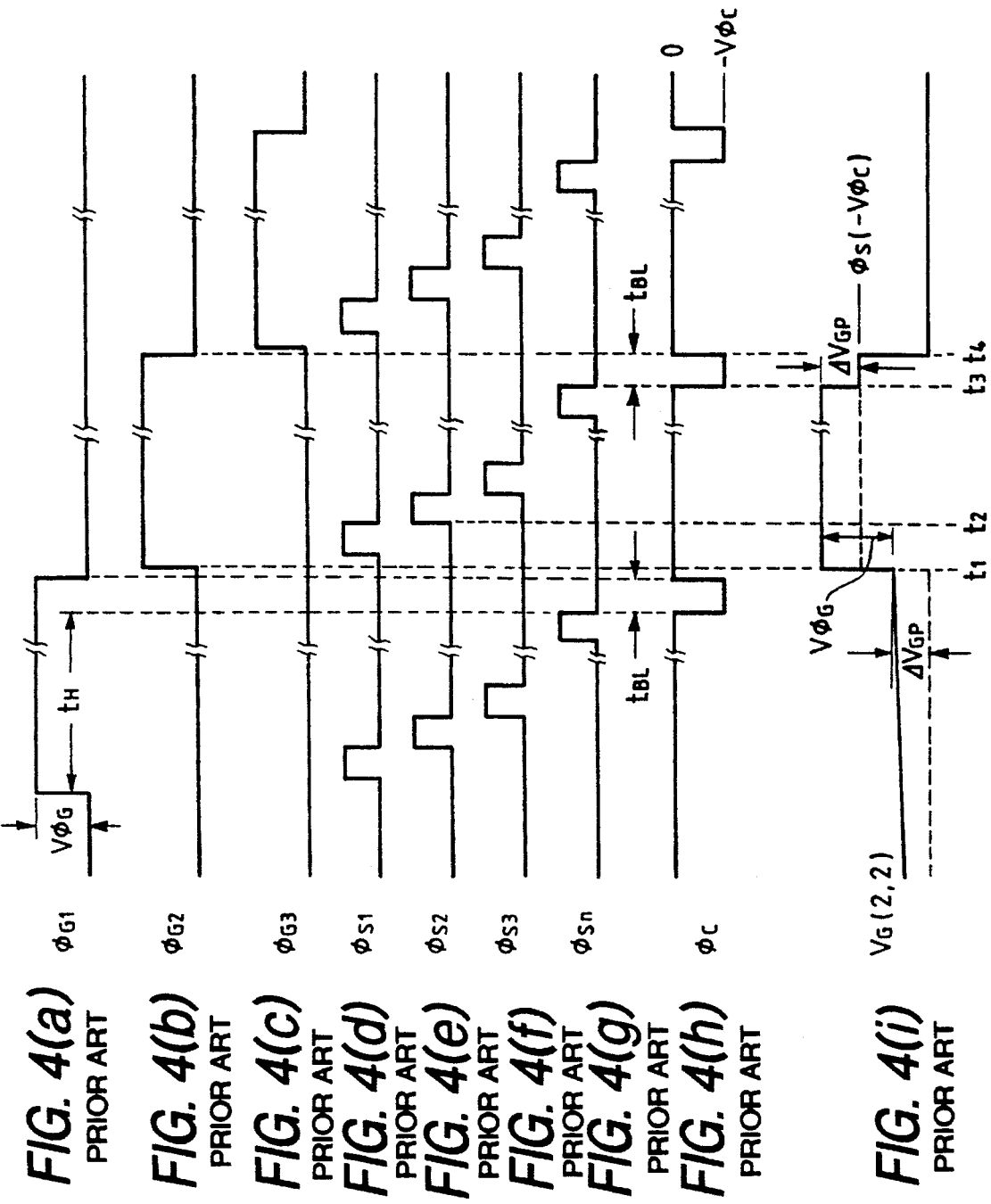
FIG. 4 is a pulse timing chart showing the operation of a conventional solid-state image pickup device.
Figure 5:
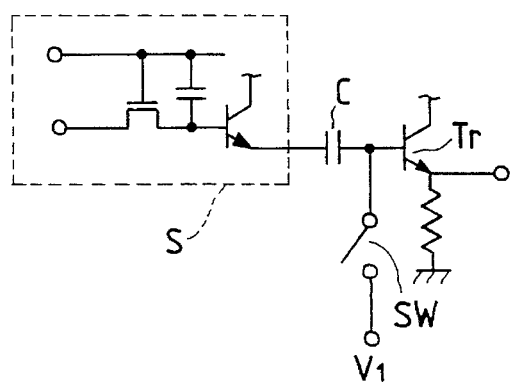
FIG. 5 is a diagram explaining the function of the solid-state image pickup device according to the third embodiment of the present invention.
Figure 6:
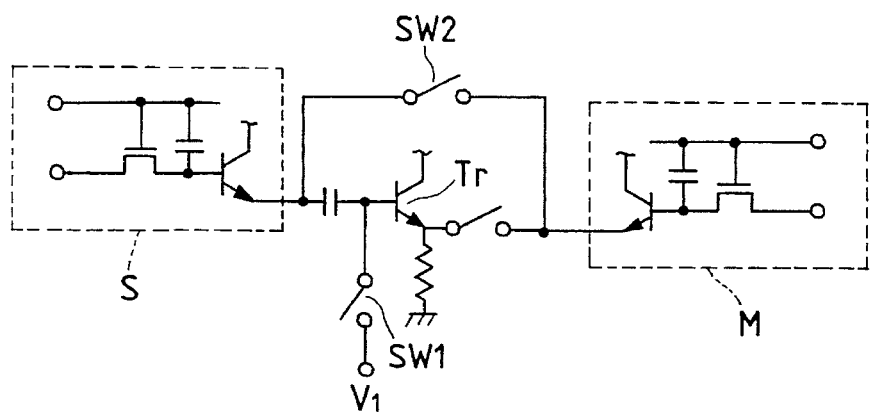
FIG. 6 is a diagram explaining the function of the solid-state image pickup device according to the third embodiment of the present invention.
Figure 7:
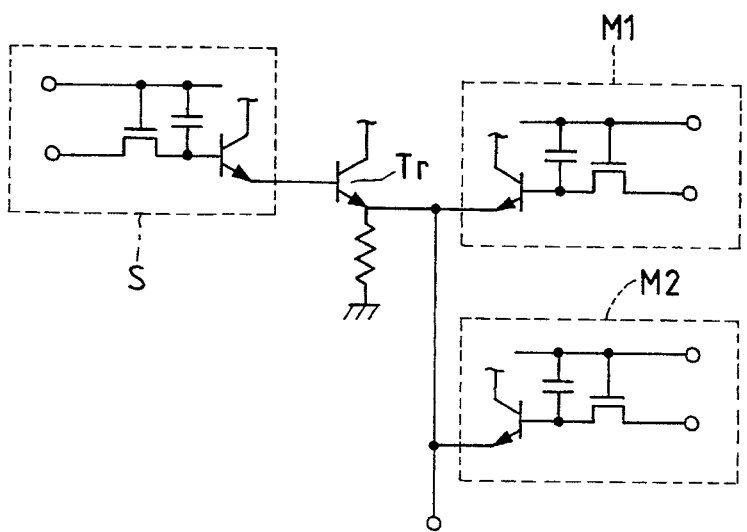
FIG. 7 is a diagram explaining the function of the solid-state image pickup device according to the third embodiment of the present invention.

The operation of the solid-state pickup device shown in FIG. 11 will be explained with reference to the timing chart shown in FIG. 2. According to the present invention, the operation is characterized that the differential signal created based on the external light signal at an LED-OFF time and the signal at an LED-ON time is accumulated to an accumulating pixel.

The accumulating operation at LED-OFF time, clamp and reset operations are performed as follows:

When a pulse at a low level is applied to the terminals 135 and 147, the bases of the emitter follower circuits 133 and 145 are fixed to the positive potential of the power source terminal 136 so that the peripheral source region of the p-MOS transistor which forms an imaging pixel and an accumulating pixel becomes a positive potential. As a result, since all the p-MOS transistors 3 and 123 become conductive, the bases of all the bipolar transistors 1 and 121 are the same potential as the output from the emitter follower circuits 133 and 145. Next, when a pulse at a high level is applied to the terminals 13 and 132, all the emitters connected to the vertical output lines 4 and 124 are Grounded so that the base potentials of the bipolar transistors 1 and 121 are lowered to about or about 0.6 volts. This procedure is called a clamping operation. As described above, the above-configuration performs the clamping operations of the imaging unit and the accumulating unit. At this time, the MOS transistors 138 and 143 are in an off state and the MOS transistor 141 is in an on state.

Next, with a pulse at a high level applied to the terminal 127, the vertical output line 4 fixed at a power source potential of the power source 128, and a pulse at a high level applied to the terminal 15, the horizontal drive line 5 selected by the vertical shift register I is in a high level. Then, the base potential of the bipolar transistor 1 associated with a line selected through a capacitive coupling of the capacitor 2 is boosted to a positive direction. However, since the emitter potential is fixed to the power source potential of the power source 128, the base potential drops to a certain fixed level due to the base current. When the pulse applied to the terminal 15 becomes a low level, the base potential is decreased lower than the emitter potential because of a capacitive coupling through the apacitor 2, whereby a photo carrier accumulation begins. This sequential procedure is called a resetting operation. This resetting operation is performed to a row sequentially selected by the vertical shift register I. The accumulating operation starts at the time the resetting operation is over and then a signal is accumulated into the base of the bipolar transistor 1.

After the accumulating operation in the imaging portion, the signal transferring operation is carried out from the imaging portion to the accumulating portion.

In order to read the signal from the imaging portion, the MOS transistor 131 is turned on while a negative pulse is applied to the terminal 139. Furthermore the base potential of the bipolar transistor 129 is fixed to a certain voltage and then set in a floating state. Next, the vertical shift register I sequentially sets the horizontal drive lines 5 to a high level to boost positively the base potential of the bipolar transistor 1, thus flowing the emitter current. When the emitter potential of the bipolar transistor 1 rises, the base potential of the bipolar transistor 129 rises through the capacitive coupling of the capacitor 137. Then, the emitter follower formed of the bipolar transistor 129 and the MOS transistor 131 writes the output into the accumulation pixel through the MOS transistor 141.

In the writing operation to an accumulation pixel, the vertical shift register II sequentially applies the pulse φw to the horizontal drive lines 125. The pulse φw applied to the terminal 18 to transfer signals is set to a high level, a low level, and a middle level. The electric charge corresponding to the charge accumulated into a pixel of the imaging portion at the LED-OFF time is stored into the accumulation pixel.

Next, the clamping and resetting operations and the accumulating operations at a LED-ON time are similar to those described above. Since these operations are applicable only to the light receiving portion, the terminal 147 remains the high level. Next, the differential signal transfer which is the feature of the third embodiment of the present invention is done. First, when a low pulse is input to the terminals 139 and 142, a middle pulse is input to the terminal 18, and a high pulse is input to the terminal 144, the output of the accumulation pixel appears on the vertical output line 4 via the MOS transistor 143. The base of the bipolar transistor 129 is fixed to the potential of the power source terminal 140 and then set in a floating state. Next, when the vertical output line 4 is reset to a predetermined potential by applying a high pulse to the terminal 127, the base potential of the bipolar transistor 129 drops by a voltage difference because the potential of the vertical output line 4 is sagged due to the capacitive coupling of the capacitor 137. That is, the inverted output voltage of the signal at the LED-OFF time appears on the base of the bipolar transistor 129. In this state, when a high level pulse is input to the terminals 15 and 18, the output potential of a image pixel, or the signal at the LED-OFF time, is added to the base potential of the bipolar transistor 129. Hence, the differential signal output which is obtained by subtracting an external light signal component appears on the base of the bipolar transistor 129. Thus, the output from the emitter follower formed of the bipolar transistor 129 and the MOS transistor 131 is written into the accumulation pixel through the MOS transistor 141. When the signal amount of the LED light is larger than that of the external light, the potential of the vertical output line 124 at the second writing time is higher, compared with the first transfer writing time. However, the bipolar transistor 121 can be sufficiently forward biased even at the second writing time by grading the level of the pulse φw to the terminal 18.

After the differential signal has been transferred and stored into the accumulation portion, the signal is read out of the accumulation portion by boosting positively the base potential of the bipolar transistor 121, with the horizontal drive line 125 set at a high level, and thus flowing the emitter current. Thereafter, the horizontal shift register transfers the signal of the capacitor 7 to the horizontal output line 9 and then outputs it from the sensor output terminal 16 via the pre-amplifier 12.

Through the operation described above, the differential potential which is obtained by subtracting the first accumulation output from the light receiving portion (imaging portion) from the second accumulation output in the light receiving portion can be written into the accumulation pixel. The output of the accumulation pixel stored through the first writing operation includes F.P.N. (fixed pattern noise) from each of the light receiving pixel (imaging portion), the bipolar transistor 129, and the accumulation pixel, and an external light signal. Finally, the differential output is read as a signal with high S/N ratio out of the accumulation pixel because all the noise components are removed.

Figure 12:
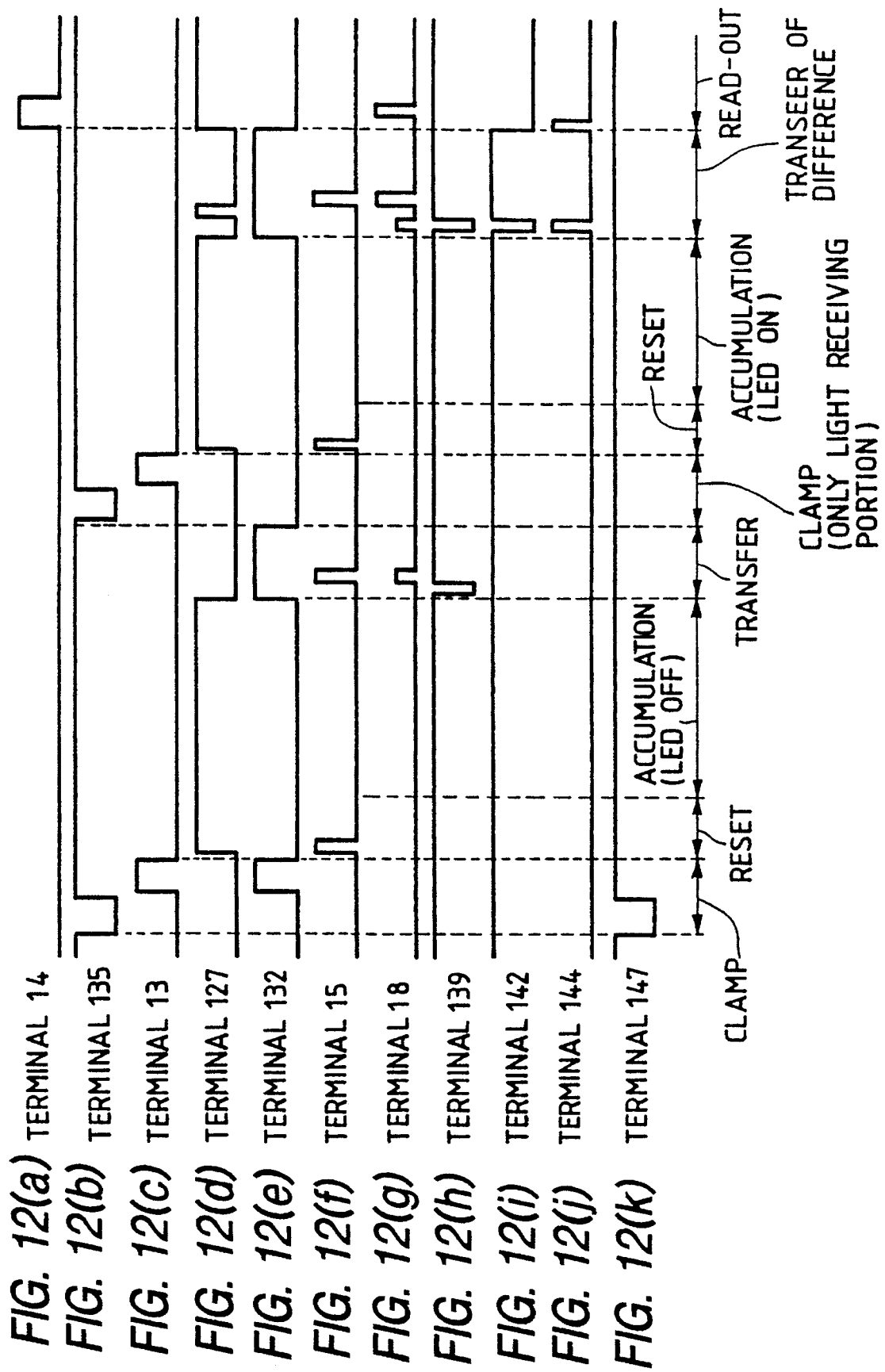
FIG. 12 is a pulse timing chart used for explaining the operation of the solid-state image pickup device shown in FIG. 11.

According to the solid-state image pickup device of the fourth embodiment of the present invention, the noise due to the sensor is removed by a differentiating process, but removing external light is not purposed. This purpose is achieved using the sensor circuit shown in FIG. 11. In operation, the process between the first clamping and resetting operations are similar to those shown in FIG. 12. Next, without performing the accumulation operation, the pixel output from the light receiving portion (imaging portion) immediately after the resetting operation is transferred and written to the accumulation pixel. Next, the light receiving pixel is subjected to an accumulation operation without any other operation and then the differential potential is transferred. Like the first embodiment, the output read out of the accumulation pixel does not include F.P.N. of each of the light receiving portion pixel, the emitter follower associated with each column line, and the accumulation pixel. Moreover, the reset noise of the light receiving pixel appearing as random noises also is removed by differentiating the outputs in the same resetting operation.

Figure 13:
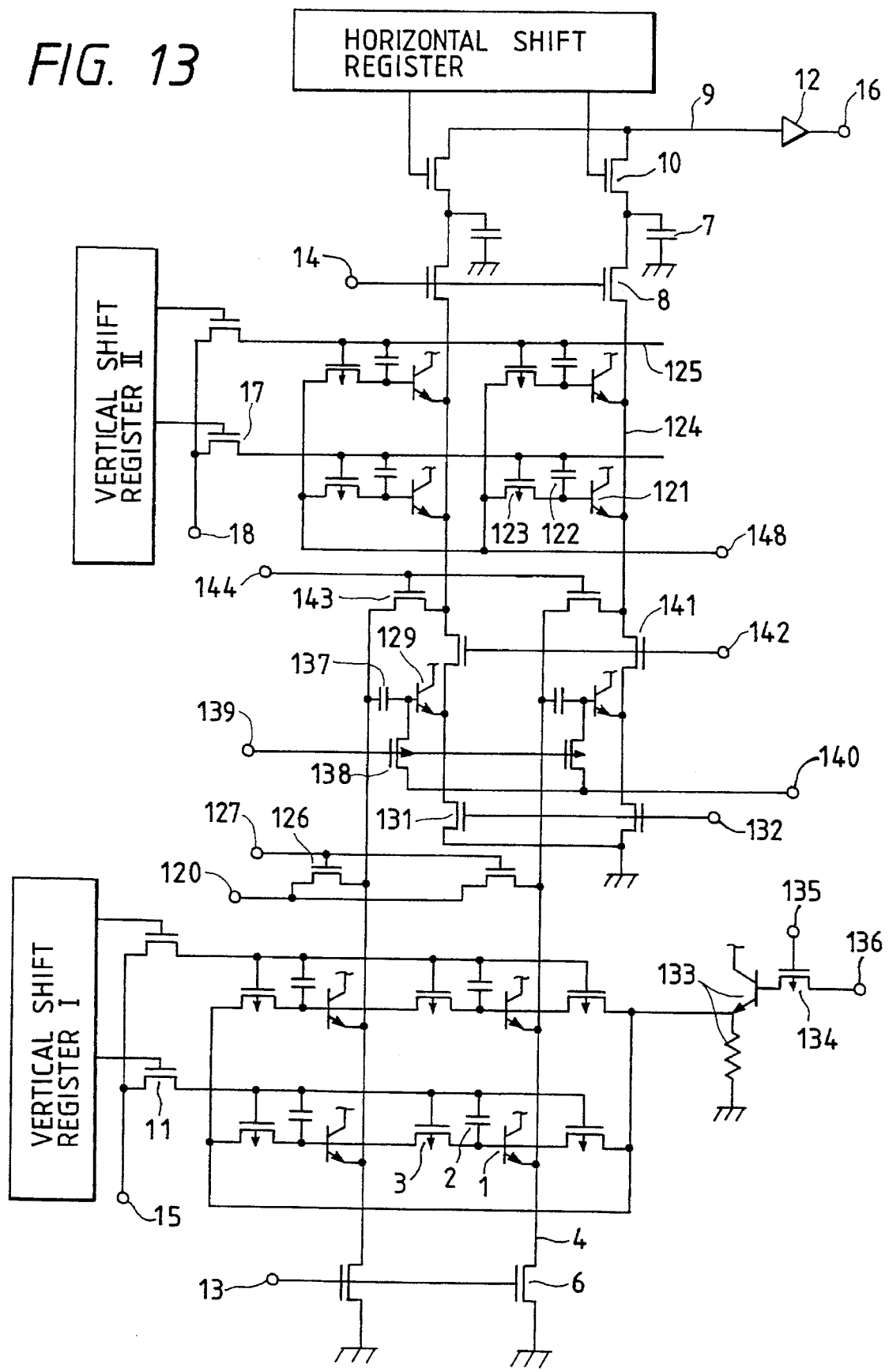
FIG. 13 is a schematic circuit diagram showing the solid-state image pickup device according to the fifth embodiment of the present invention.
Figure 14:
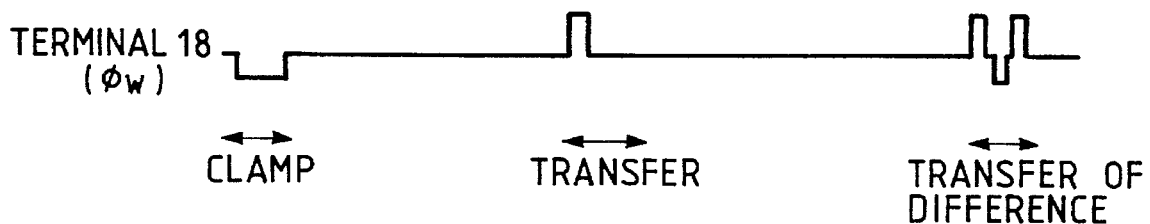
FIG. 14 is a pulse timing chart showing the pulse φw input to the solid-state image pickup device shown in FIG. 13.

The solid-state image pickup device according to the fifth embodiment of the present invention will be explained with reference to FIG. 13. Referring to FIG. 13, the power source terminal 148 is connected directly to the drain of the p-MOS transistor for each accumulation pixel to determine the clamp level of the base of the accumulation pixel. In this figure, like numerals are attached to the same elements as those shown in FIG. 11. Hence, the duplicate explanation will be omitted here. The sequential operation of the sensor is substantially the same as those of the third and fourth embodiments according to the present invention. In this embodiment, the terminal 47 used for the operation shown in FIG. 12 can be omitted. The operation of the present embodiment differs from the operation shown in FIG. 12 in that the pulse $\phi w$ is applied to the terminal 18. The operational difference will be explained now with reference to FIG. 14. The pulses $\phi w$ has three potentials: a low level at which the p-MOS transistor 123 is turned on, a middle level at which the p-MOS transistor 123 is turned off, and a high level. The pulse $\phi w$ is normally at a middle level. The accumulation pixel is first clamped with a low pulse and the first signal transfer is done with a high level. In the differential signal transferring, after the accumulation pixel output is output to the capacitor 137 using the high pulse, it is clamped with the low pulse. Next, the differential signal is written with the high level pulse. This circuit configuration can omit the emitter follower that swings the accumulation pixel clamping power source, thus providing the simple operation.

Figure 15:
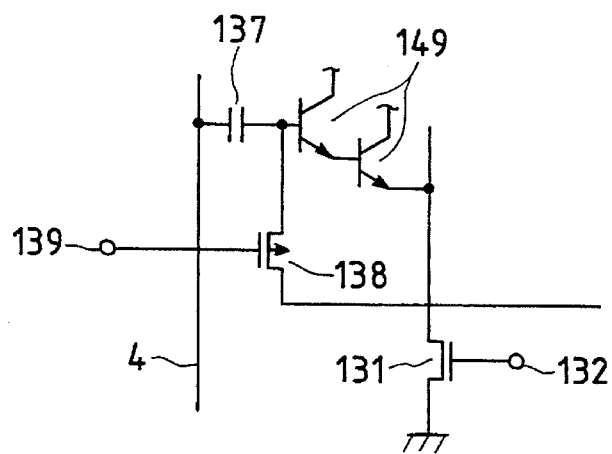
FIG. 15 is a schematic circuit diagram showing partially the solid-state image pickup device according to the sixth embodiment of the present invention.

The solid-state image pickup device of the sixth embodiment according to the present invention relates to a bipolar transistor forming an emitter follower connected to each column line. As shown in FIGS. 11 and 13, the emitter follower is formed of the bipolar transistor 129 and the MOS transistor 131. Since the bipolar transistor 129 operates with its base in a floating state, the base potential decreases during the operation of the emitter follower. In this embodiment, as shown in FIG. 15, the Darlington-type bipolar transistor 149 is substituted for the bipolar transistor. This circuit configuration can sufficiently suppress the drop in the base potential during the operation of the emitter follower, thus decreasing the attenuation of the transfer signal.

The operation of the solid-state image pickup device of the seventh embodiment according to the present invention will be explained with reference to FIG. 16. Referring to FIG. 16, numerals 7-1 and 7-2 represent capacitors each of which stores the output signal from an accumulation pixel; 8-1 and 8-2 represent MOS transistors which transfer the output from an accumulation pixel to the capacitors 7-1 and 7-2, respectively; 14-1 and 14-2 represent terminals which input pulses to the bases of the MOS transistors 8-1 and 8-2, respectively; 9-1 and 9-2 represent horizontal output lines; 10-1 and 10-2 represent MOS transistors which transfer the outputs of the capacitors 7-1 and 7-2 to the horizontal output lines 9-1 and 9-2, respectively; and 150 represents a differential amplifier connected to the horizontal output lines 9-1 and 9-2. Numeral 7-1, 7-2, . . . , 14-1 and 14-2 correspond respectively to the capacitor 7; the MOS transistor 8; the horizontal output line 9; the MOS transistor 10; and the terminal 14, shown in FIG. 11. In this embodiment, all the elements are arranged in two sets.

In this embodiment, the base of the emitter follower formed of the bipolar transistor 129 and the MOS transistor 131 is directly connected to the vertical output line 4. Unlike the third embodiment, the capacitor 137 and the p-MOS transistor 138 are not arranged in the present embodiment. The resetting, accumulating, reading, and writing processes of each of the sensor portion (imaging portion) and the memory portion (accumulating portion) are the same as those in the third embodiment. In the seventh embodiment, the sensor operates twice. In the first operation, both a signal and an external light signal are accumulated. In the second operation, only the external light signal is accumulated. Two kinds of memories—one for writing a signal and external light, and the other for writing only an external light—are prepared (the number of memory cells is twice that of the sensor cells). After the memory cells read out those outputs to the capacitors 7-1 and 7-2, respectively, the horizontal shift register transfers simultaneously them to the horizontal output lines 9-1 and 9-2, respectively, thus inputting them to the differential amplifier 150. This operation allows a signal with a high S/N ratio to be output to the output terminal 16, the signal from which the external light component, the variation in the light receiving cells, and the variation in each of the emitter followers 129 and 131 are subtracted.

As described above, according to the third to seventh embodiments, the operation by which F.P.N. of the sensor, or, if necessary, the undesirable external light signal and the random noise of the sensor is subtracted can be realized. Furthermore, since the amplified signal can be stored into the accumulation portion, the sensor output with high S/N ratio can be obtained.

Moreover, since the signal from the signal accumulation pixel (memory cell) is read non-destructively, it is possible to perform the reading operation several times.

In the above-explanation, the bipolar transistor (with a base acting as a control electrode and an emitter or collector acting as a main electrode) has been preferably used as the transistor which is capacitively connected to the output of a photoelectric conversion pixel. However, it should not be limited only to the use of a bipolar transistor, but field-effect transistors, for example, may be used in the embodiments. A pixel that includes a bipolar transistor storing a signal as a base potential has been used as a photoelectric conversion pixel or a signal accumulation pixel. However, in the present invention, the pixel should not be limited to the above-pixel structure. Any elements each acting as an amplification-type sensor can be preferably used as a pixel..

What is claimed is:

1. A solid-state image pickup device, wherein plural photoelectric conversion pixels, each of which accumulates electric charges created due to energy of received light and produces amplified electric charges, are arranged in a matrix form, comprising:

a respective capacitor having an input terminal connected to each of said plural photoelectric conversion pixels, each capacitor further having an output terminal;

a respective transistor having a control electrode connected to said output terminal of each said capacitor;

a respective first switch for switching each said control electrode to a first predetermined potential or an electrically-floated state;

a respective second switch for selectively switching said input terminal of each said capacitor to a second predetermined potential or an electrically-floated state;

a respective third switch for selectively inputting a predetermined stored signal to said input terminal of each said capacitor;

a respective signal accumulating pixel which accumulates an output signal from each said transistor; and a respective fourth switch for connecting an output line for each said photoeletric conversion pixel to an output line for said respective signal accumulation pixel.

2. The solid-state image pickup device according to claim 1, wherein each said photoelectric conversion pixel and said respective signal accumulation pixel have a same type.

3. The solid-state image pickup device according to claim 1, wherein each said signal accumulation pixel comprises a bipolar transistor to which an output signal from said respective transistor is written as a base potential.

* * * * *

UNITED STATES PATENT AND TRADEMARK OFFICE
CERTIFICATE OF CORRECTION

PATENT NO.  : 5,587,738
DATED       : December 24, 1996
INVENTOR(S) : MAHITO SHINOHARA It is certified that error appears in the above-identified patent and that said Letters Patent is hereby corrected as shown below:

COLUMN 1

Line 21, "(in figure," should read --(in the figure,--.
Line 41, "$V_C$," should read --$V_C$.--.

COLUMN 2

Line 46, "a" should be deleted.
Line 56, "$\phi_S(O)$" should read --$\phi_S(0)$--.
Line 61, "$\phi_S$" should read --$\phi_C$--.

COLUMN 3

Line 12, "-$V_C$," should read -- -$V\phi_C$--.
Line 18, "$\phi_S(-V\phi_C)-V\phi_{G\ +\Delta VGP}>\phi_S(-V\phi_C)$," should read --$\phi_S(-V\phi_C)-V\phi_G+\Delta V_{GP}>\phi_S(-V\phi_C)$,--.
Line 20, "Gate" should read --gate--.
Line 23, "Gate" should read --gate--.

COLUMN 4

Line 45, "the further" should be deleted.

COLUMN 6

Line 55, "on" should read --of--.

UNITED STATES PATENT AND TRADEMARK OFFICE
CERTIFICATE OF CORRECTION

PATENT NO. : 5,587,738

DATED : December 24, 1996

INVENTOR(S): MAHITO SHINOHARA

It is certified that error appears in the above-identified patent and that said Letters Patent is hereby corrected as shown below:

COLUMN 7

Line 54, "wish" should read --with--.

COLUMN 8

Line 24, "$\phi R$" should read --$\phi_R$--.
  Line 47, "se s" should read --sets--.
  Line 65, "M0S" should read --MOS--.

COLUMN 9

Line 18, "2." should read --12.--.
  Line 36, "Grounded" should read --grounded--.
  Line 38, "about" (first occurrence) should read --about $V_{BE}$--.
  Line 57, "apacitor" should read --capacitor--.

COLUMN 10

Line 42, "a" should read --an--.

COLUMN 12

Line 14, "each" should read --each of--.
  Line 26, "Numeral" should read --Numerals--.
  Line 49, "simultaneously them" should read --them simultaneously--.

UNITED STATES PATENT AND TRADEMARK OFFICE
CERTIFICATE OF CORRECTION

PATENT NO. : 5,587,738

DATED : December 24, 1996

INVENTOR(S) : MAHITO SHINOHARA

It is certified that error appears in the above-identified patent and that said Letters Patent is hereby corrected as shown below:

<u>COLUMN 13</u>

Line 14, "pixel.." should read --pixel.--.

Signed and Sealed this

Fifth Day of August, 1997

Attest:

BRUCE LEHMAN

Attesting Officer

Commissioner of Patents and Trademarks